(12) United States Patent
Cheng et al.

(10) Patent No.: US 9,799,569 B2
(45) Date of Patent: Oct. 24, 2017

(54) METHOD OF FORMING FIELD EFFECT TRANSISTORS (FETS) WITH ABRUPT JUNCTIONS AND INTEGRATED CIRCUIT CHIPS WITH THE FETS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/396,943

(22) Filed: Jan. 3, 2017

(65) Prior Publication Data

US 2017/0117189 A1    Apr. 27, 2017

Related U.S. Application Data

(62) Division of application No. 14/750,120, filed on Jun. 25, 2015, now Pat. No. 9,595,595.

(51) Int. Cl.
| | |
|---|---|
| *H01L 21/00* | (2006.01) |
| *H01L 21/8238* | (2006.01) |
| *H01L 29/66* | (2006.01) |
| *H01L 21/225* | (2006.01) |
| *H01L 21/283* | (2006.01) |
| *H01L 21/321* | (2006.01) |
| *H01L 21/3213* | (2006.01) |
| *H01L 27/092* | (2006.01) |

(Continued)

(52) U.S. Cl.
CPC .. *H01L 21/823828* (2013.01); *H01L 21/2251* (2013.01); *H01L 21/283* (2013.01); *H01L 21/32115* (2013.01); *H01L 21/32133* (2013.01); *H01L 21/823814* (2013.01); *H01L 21/823864* (2013.01); *H01L 27/092* (2013.01); *H01L 29/0649* (2013.01); *H01L 29/495* (2013.01); *H01L 29/66545* (2013.01)

(58) Field of Classification Search
CPC ..... H01L 21/823828; H01L 21/823814; H01L 29/66545; H01L 21/283
See application file for complete search history.

(56) References Cited

U.S. PATENT DOCUMENTS

| | | | |
|---|---|---|---|
| 8,236,658 B2 * | 8/2012 | Kuan | H01L 21/823807 257/E21.431 |
| 8,592,264 B2 | 11/2013 | Ando et al. | |

(Continued)

*Primary Examiner* — Laura Menz
(74) *Attorney, Agent, or Firm* — Law Office of Charles W. Peterson, Jr.; Louis J. Percello, Esq.

(57) ABSTRACT

A method of forming field effect transistors (FETs) and on Integrated Circuit (IC) chips with the FETs. Channel placeholders at FET locations are undercut at each end of FET channels. Source/drain regions adjacent to each channel placeholder extend into and fill the undercut. The channel placeholder is opened to expose channel surface under each channel placeholder. Source/drain extensions are formed under each channel placeholder, adjacent to each source/drain region. After removing the channel placeholders metal gates are formed over each said FET channel.

9 Claims, 10 Drawing Sheets

(51) Int. Cl.
*H01L 29/06* (2006.01)
*H01L 29/49* (2006.01)

(56) References Cited

U.S. PATENT DOCUMENTS

| | | | |
|---|---|---|---|
| 8,673,699 B2 * | 3/2014 | Adam | H01L 21/84 |
| | | | 257/347 |
| 8,673,708 B2 | 3/2014 | Cheng et al. | |
| 9,472,628 B2 * | 10/2016 | Cheng | H01L 29/267 |
| 9,595,595 B2 * | 3/2017 | Cheng | H01L 29/66545 |
| 2002/0058372 A1 * | 5/2002 | Jang | H01L 21/823842 |
| | | | 438/200 |
| 2010/0038705 A1 * | 2/2010 | Doris | H01L 21/28026 |
| | | | 257/327 |
| 2011/0147838 A1 | 6/2011 | Gossner et al. | |
| 2012/0043623 A1 * | 2/2012 | Doris | H01L 21/28114 |
| | | | 257/410 |
| 2012/0261754 A1 * | 10/2012 | Cheng | H01L 29/66772 |
| | | | 257/347 |
| 2013/0082311 A1 * | 4/2013 | Cheng | H01L 29/7834 |
| | | | 257/288 |
| 2013/0161745 A1 * | 6/2013 | Ando | H01L 29/78621 |
| | | | 257/347 |
| 2013/0285123 A1 * | 10/2013 | Adam | H01L 21/30608 |
| | | | 257/255 |
| 2014/0051216 A1 | 2/2014 | Cheng et al. | |
| 2016/0013313 A1 * | 1/2016 | Cheng | H01L 29/267 |
| | | | 257/408 |
| 2016/0359046 A1 * | 12/2016 | Cheng | H01L 29/267 |
| 2016/0380074 A1 * | 12/2016 | Cheng | H01L 29/66545 |
| | | | 438/305 |
| 2017/0117189 A1 * | 4/2017 | Cheng | H01L 21/823828 |

* cited by examiner

METHOD OF FORMING FIELD EFFECT TRANSISTORS (FETS) WITH ABRUPT JUNCTIONS AND INTEGRATED CIRCUIT CHIPS WITH THE FETS

CROSS REFERENCE TO RELATED APPLICATION

The present application is a divisional application of U.S. patent application Ser. No. 14/750,120, "METHOD OF FORMING FIELD EFFECT TRANSISTORS (FETS) WITH ABRUPT JUNCTIONS AND INTEGRATED CIRCUIT CHIPS WITH THE FETS" to Kangguo Cheng et al., filed Jun. 25, 2015, assigned to the assignee of the present invention and incorporated herein by reference.

BACKGROUND OF THE INVENTION

Field of the Invention

The present invention generally relates to Integrated Circuit (IC) manufacture and more particularly to manufacturing integrated circuits with metal gate Field Effect Transistors (FETs) with abrupt junctions.

Background Description

Primary integrated circuit (IC) chip manufacturing goals include increasing chip density and performance at minimized power consumption, i.e., packing more function operating at higher speeds in the same or smaller space. Transistors or devices are formed by stacking layers of shapes on the IC, e.g., printed layer by layer on a wafer using photolithographic techniques. A simple field effect transistor (FET), or device, is defined by the intersection of two shapes, one for channel and one for gate. Generally, device current is governed by the ratio of its width to length. Shrinking/reducing chip feature sizes to increase density and performance provides a corresponding reduction in minimum device dimensions, e.g., minimum channel length. Using shorter devices allows/requires thinner vertical feature dimensions, e.g., a shallower channel layer and junction depth, thinner gate dielectric, and connecting wires and vias.

Most state of the art ICs are made on a bulk wafer or in silicon on insulator (SOI) wafer, in the well-known complementary insulated gate field effect transistor (FET) technology known as CMOS for minimized power consumption. A typical CMOS circuit includes paired complementary devices, or FETs, i.e., an n-type FET (NFET) paired with a corresponding p-type FET (PFET), usually both gated by the same signal. Since the pair of devices in an ideal inverter have operating characteristics that are, essentially, opposite each other, when one device (e.g., the NFET) is on and conducting (modeled simply as a closed switch), the other device (the PFET) is off, not conducting (modeled as an open switch) and, vice versa. With one switch closed and the other open, ideally, there is no static current flow.

No device is ideal, however, and there are unwanted currents flowing even in off devices. Further, as device dimensions shrink, previously negligible device characteristics have become appreciable. For example, gate to channel, gate to source/drain, subthreshold current, and other short channel effects may be problematic in state of the art short channel FETs. Especially for complex chips and arrays with a large number of devices, these short channel effects can be overwhelming. When multiplied by the millions and even billions of devices on a state of the art IC, even 100 picoAmps (100 pA) of leakage in each of a million circuits, for example, results in chip leakage on the order of 100 milliAmps (100 mA).

Replacing FET gate oxide with a high-k dielectric has eliminated most of the unwanted gate oxide leakage, e.g., gate to channel and/or gate to source/drain. Since, polysilicon cannot be used with high-k dielectrics, work function metal and aluminum is being used for gates instead of polysilicon. In what is known as Replacement Metal Gate (RMG) FETs, typical polysilicon gate FETs are formed through source/drain extension, source/drain diffusion and interlayer dielectric (ILD) formation on the source/drain diffusions. Then, the polysilicon gates are removed and replaced, e.g., when contacts are formed through the ILD.

Unfortunately, forming well-controlled abrupt junctions using state of the art RMG manufacturing processes has been challenging. These processes typically involve various annealing temperatures post extension and source/drain junction formation. These various annealing temperatures affect junction position, e.g., causing unwanted out-diffusion. Diffusing FET junctions may tend to migrate towards each other enhancing short-channel effects. Moreover, high-mobility channel materials, such as germanium (Ge) or III-V semiconductor, have well known material instability issues with very high temperature dopant drive-in, or activation. Source/drain junctions in these materials become very resistive as a result of the low temperature processing required to form a high-k/metal gate (HK/MG) stack, i.e., to replace polysilicon gates with metal gates.

Thus, there is a need for reducing short channel effects for RMGFETs; and more particularly, for forming abrupt junctions that are unaffected by subsequent RMGFET formation steps.

SUMMARY OF THE INVENTION

In an aspect of the invention short channel effects are reduced in Integrated Circuit (IC) field effect transistors (FETs) without impairing performance;

In another aspect of the invention abrupt junctions for replacement metal gate FETs (RMGFETs) form unaffected by high temperature annealing in source drain epitaxy growth and diffusion;

In yet another aspect of the invention source/drain extensions for RMGFETs, form well controlled, and after forming interlayer dielectric (ILD) on completed RMGFET source/drain regions;

In yet another aspect of the invention short channel effects are reduced/minimized in ICs with preferred RMGFETs source/drain extensions that are formed well controlled after forming interlayer dielectric (ILD) on already completed RMGFET source/drain regions;

The present invention relates to a method of forming field effect transistors (FETs) and on Integrated Circuit (IC) chips with the FETs. Channel placeholders at FET locations are undercut at each end of FET channels. Source/drain regions adjacent to each channel placeholder extend into and fill the undercut. The channel placeholder is opened to expose channel surface under each channel placeholder. Source/drain extensions are formed under each channel placeholder, adjacent to each source/drain region. After removing the channel placeholders metal gates are formed over each said FET channel.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
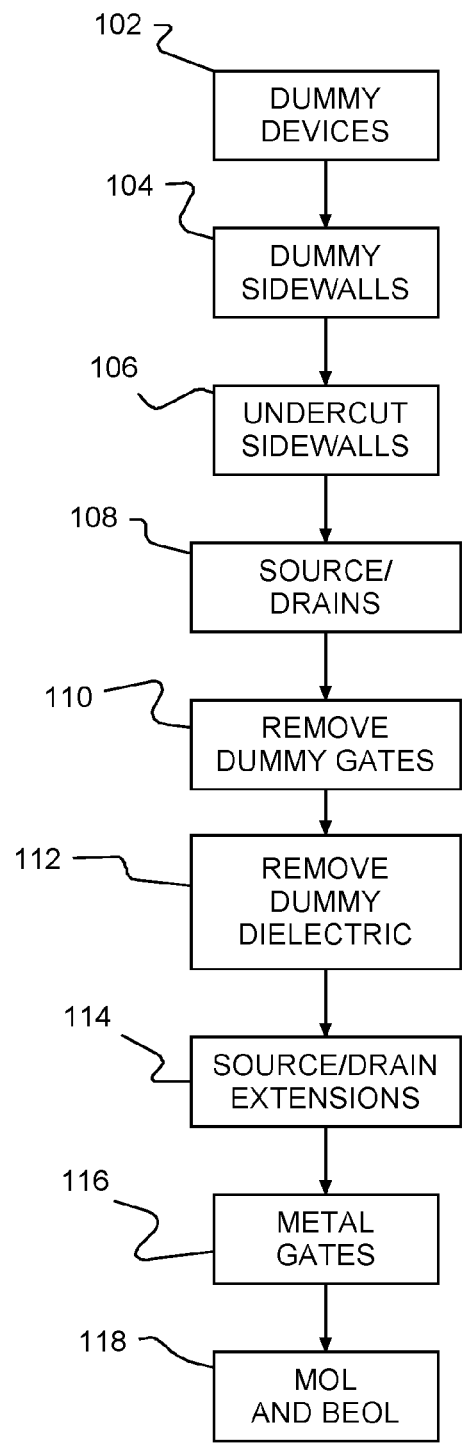
FIG. 1 shows an examples of steps of forming RMGFETs, according to a preferred embodiment of the present invention.

Turning now to the drawings and, more particularly, FIG. 1 shows an example of a method 100 of forming semiconductor devices, Replacement Metal Gate (RMG) gate Field Effect Transistors (FETs), and integrated circuit (IC) chips with preferred RMGFETs, according to a preferred embodiment of the present invention. Although described with reference to CMOS, the present invention has application to any suitable replacement metal gate technology. The preferred method 100 has application to forming RMGFETs on bulk or silicon on insulator (SOI) wafers with SOI planar, mesa, fin or nanowire channels. Bulk wafers may be silicon, germanium (Ge), a III-V semiconductor or compound thereof. Fin or nanowire channels may include more than one fin or nanowire.

Fabrication begins in step 102 defining dummy devices (FETs). Dummy sidewall spacers are formed step 104 on the dummy dielectric layer. Patterning 106 the dummy dielectric, which partially undercuts the dummy spacers. Next, 108 source/drain regions and interlayer dielectric are formed on the wafer. The dummy gates are removed in step 110 to re-expose the remaining dummy dielectric. The dummy dielectric is removed in 112. Then, source/drain extensions are formed in 114 under the dummy spacers. In step 116 metal gates are formed to complete the RMGFETs. Thereafter, in step 118 chip processing continues to complete Integrated circuit (IC) chip definition.

So, in step 102 dummy devices (FETs) are defined on a typical semiconductor wafer. Preferably, dummy FETs include dummy gates on a dummy dielectric layer. The dummy gates locate FET channels in/on a semiconductor surface of the wafer. Previously, at this point in typical prior art RMGFET formation, the dummy dielectric layer was patterned with the dummy gates (as dummy gate dielectric) and source/drain extension regions were defined adjacent to the dummy gates.

Figure 2A:
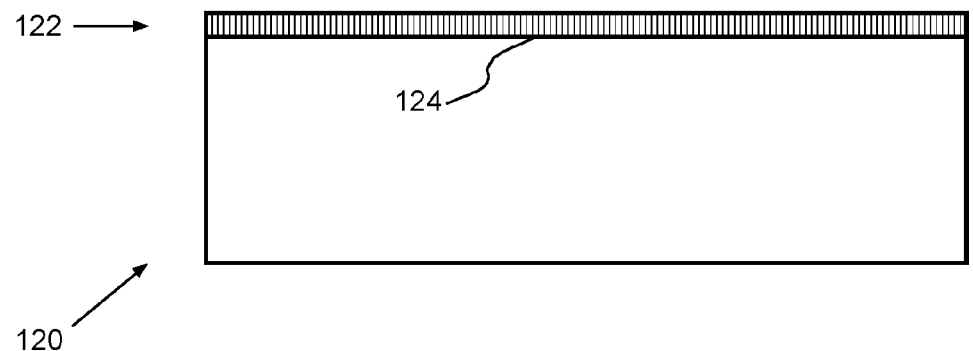
FIGS. 2A-B show an example of defining a chip device on a semiconductor wafer.
Figure 2B:
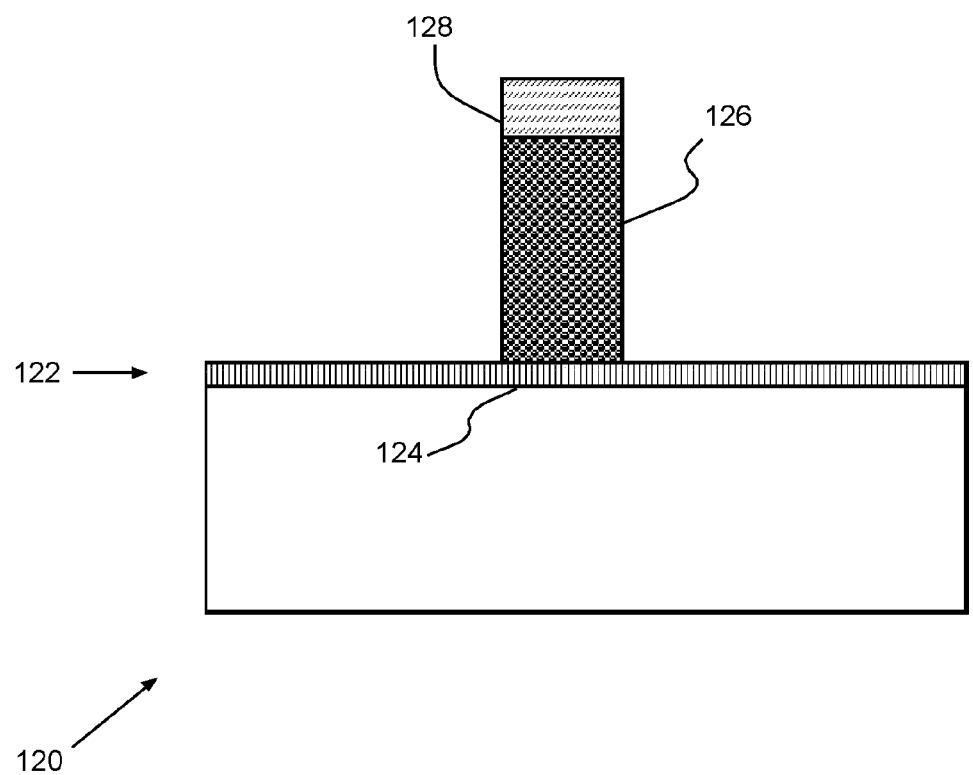

FIGS. 2A-B show an example of defining a chip device on a semiconductor wafer 120 (definition step 102 in FIG. 1).

The semiconductor wafer may be an SOI wafer or a bulk doped or undoped wafer of silicon (Si), silicon germanium (SiGe) or any suitable semiconductor. Device channels, formed in/on the semiconductor wafer 120, may be bulk surface channels or SOI channels, planar, fins or Nanowires. Channels may be defined using an active isolation step such as, for example, shallow trench isolation (STI) or mesa formation. A dummy dielectric layer 122 is, preferably, a 3 to 6 nanometer (3-6 nm) thick oxide formed on the wafer surface 124, with excellent etch selectivity to subsequently formed dummy gate 126 material. Suitable such oxides include, for example, $SiO_2$, $GeO_2$, and aluminum oxide ($Al_2O_3$).

Dummy gates 126 are formed by first forming a layer of a suitable material, e.g. polysilicon (poly), on the dummy dielectric layer 122. A hard mask 128 patterned on the dummy gate material layer defines and protects gates 126. The hard mask 128 may be any suitable material, including for example, silicon nitride ($Si_3N_4$) layer, patterned photolithographically using a suitable well know photolithographic mask and etch. After forming the hard mask 128 pattern, exposed dummy gate material is removed, e.g., etched with an etchant selective to poly. As noted hereinabove, source/drain extension regions are not defined adjacent to the dummy gates 126 at this point.

Figure 3:
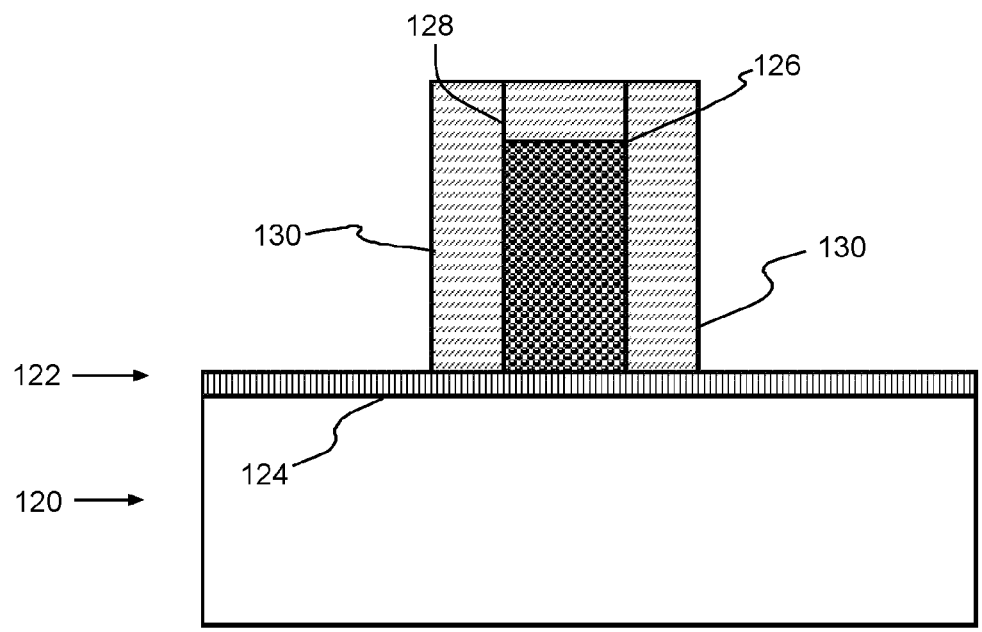
FIG. 3 shows an example of formed dummy sidewall spacers along the dummy gates on the dummy dielectric.

Instead, as shown in the example of FIG. 3, dummy sidewall spacers 130 are formed (step 104 in FIG. 1) along the dummy gates 126 and on the dummy dielectric 122. The dummy sidewall spacers 130 may be formed, for example, by forming a conformal layer of sidewall dielectric and removing horizontal portions with a directional etch, e.g., a reactive ion etch (RIE). The dummy sidewall spacer 130 dielectric may be any suitable dielectric, preferably a nitride such as, $Si_3N_4$, SiBCN, SiNH or BN.

Figure 4:
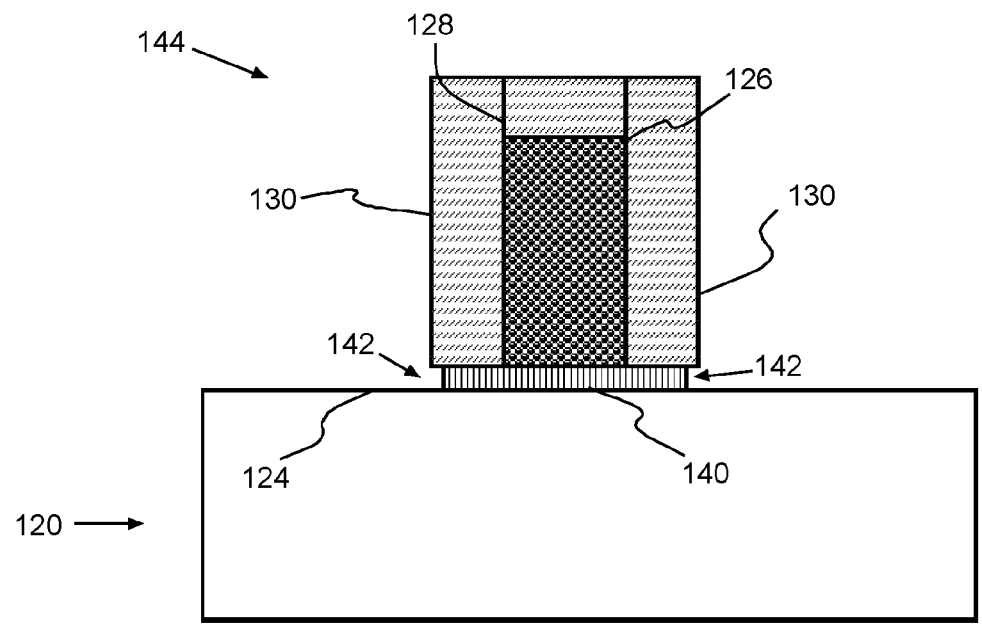
FIG. 4 shows an example of patterned dummy dielectric undercutting the dummy spacers.

FIG. 4 shows an example of patterned (106 in FIG. 1) dummy dielectric 140 undercutting the dummy spacers 130. The dummy gates 126 and sidewall spacers 130 serve as a mask for patterning 106 the dummy dielectric layer. Patterning 106 partially undercuts 142 the dummy spacers 130. The patterned dummy dielectric 140 remains under the dummy gates 126, and at least partially under dummy sidewalls spacers 130 to undercuts 142, where source/drain extension regions are subsequently formed. Patterning the dummy dielectric 140 completes placeholder 144 formation for source/drain region and interlayer dielectric formation.

Figure 5A:
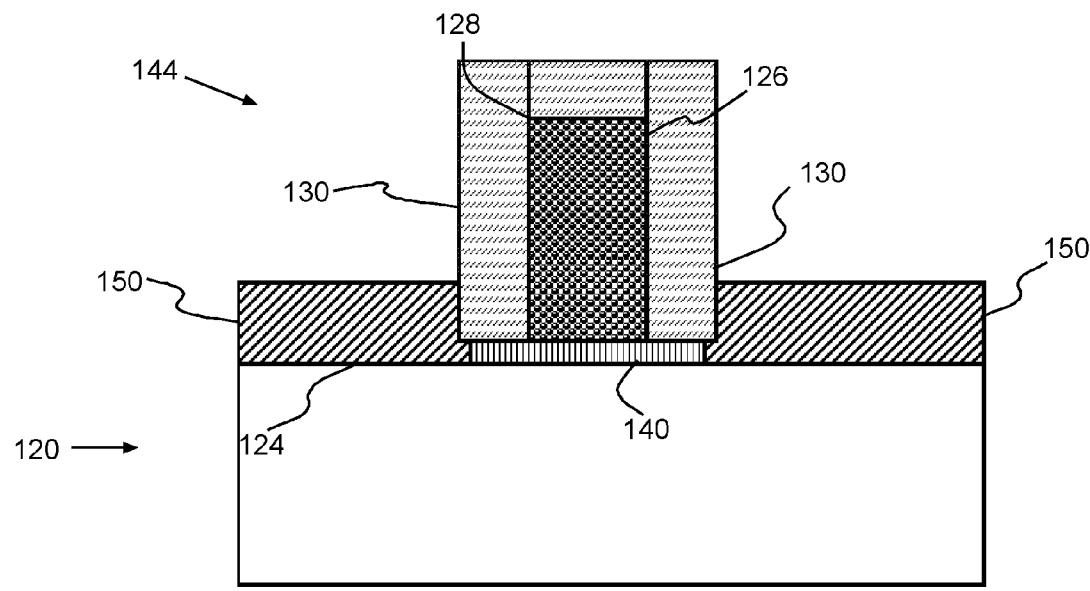
FIG. 5A-B shows an example of formed FET source/drains outboard of the dummy spacers and in the undercuts, and ILD formed on the wafer.
Figure 5B:
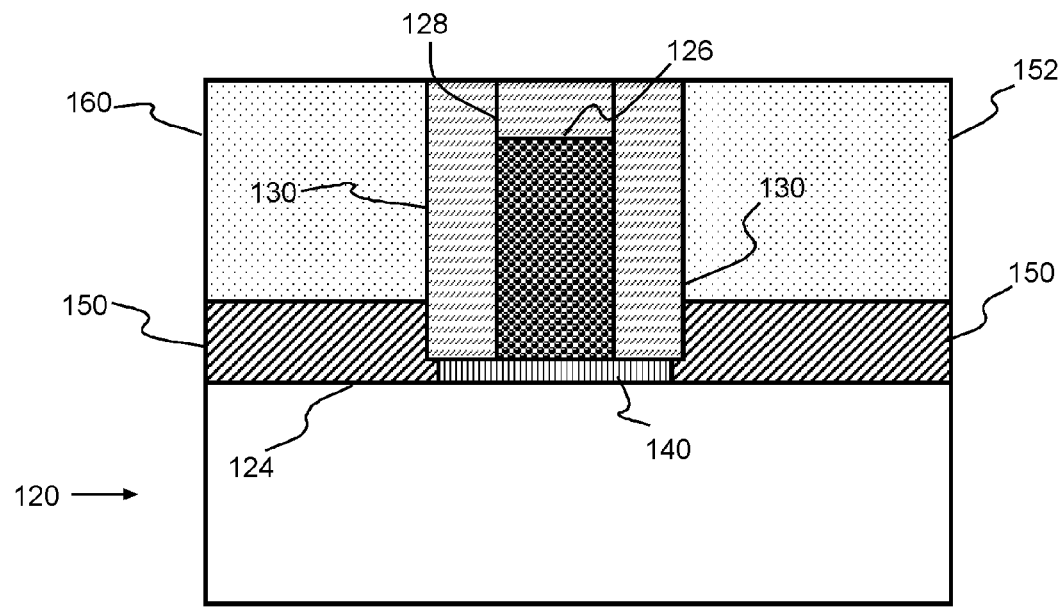

So, as shown in the example of FIGS. 5A-B, FET source/drains 150 (formed 108 in FIG. 1) form outboard of the dummy spacers 130 and extend into the placeholder undercuts 142, followed by ILD 152 formation. The FET source/drains 150 may be formed, for example, by epitaxially growing doped semiconductor on the semiconductor surface (e.g., on fins) at source/drain regions and/or by a deep source/drain ion-implant. Preferably for finFETs, doped epitaxially grown semiconductor is phosphorous or arsenic-doped silicon (Si) grown on NFET fins, and boron-doped silicon germanium (SiGe) grown on PFET fins. Interlayer dielectric 152 covers the source/drain regions 150 and fills between the placehholders 144.

Figure 6A:
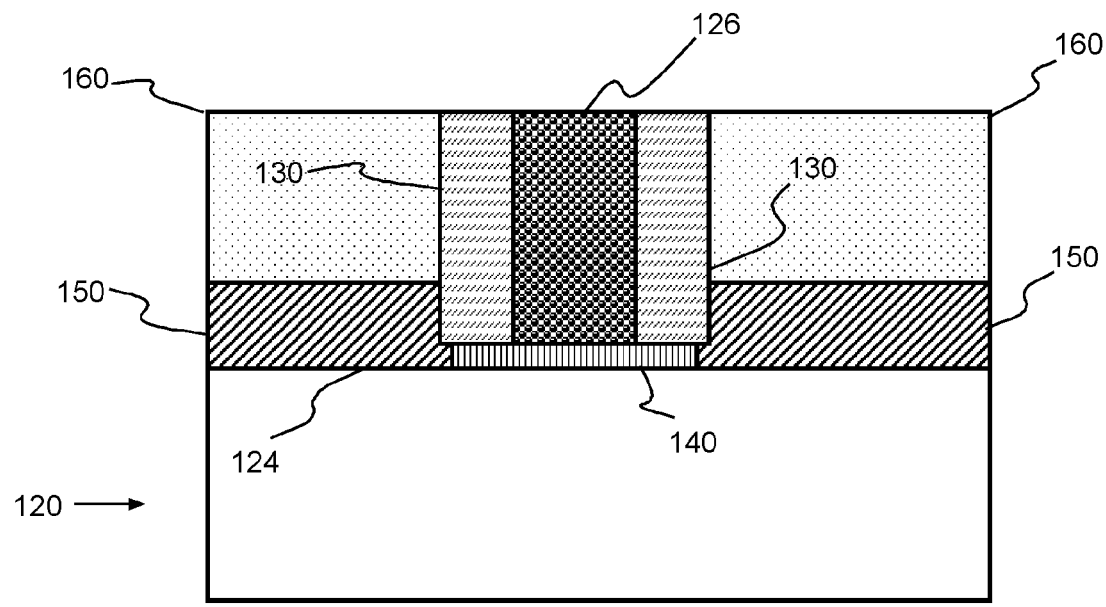
FIGS. 6A-B show an example of removing the dummy gates to re-expose the patterned dummy dielectric between the dummy spacers.
Figure 6B:
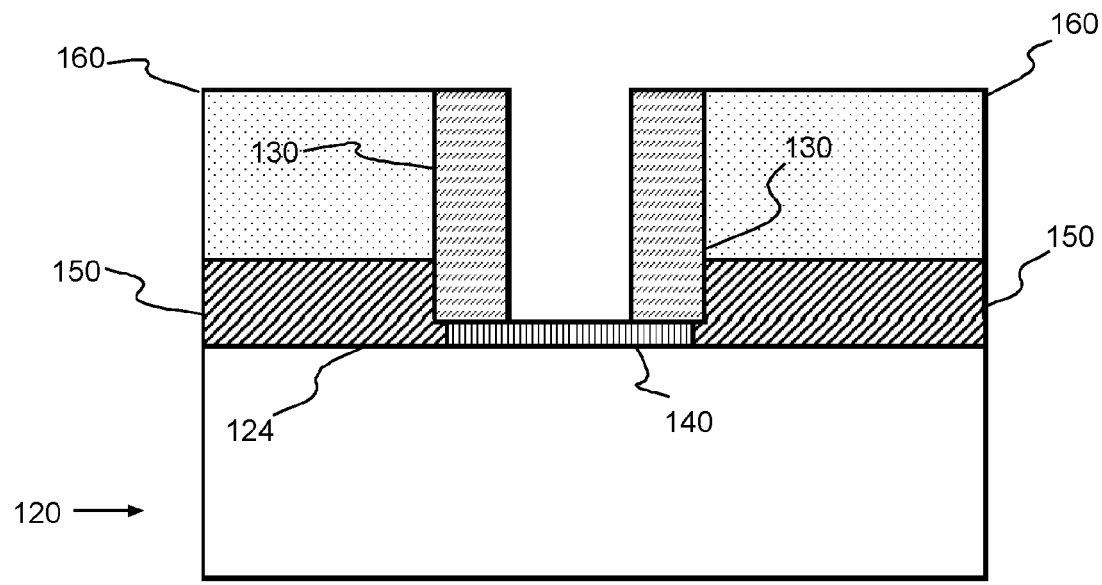

FIGS. 6A-B show an example of removing (step 110 in FIG. 1) the dummy gates 126 to re-expose the patterned dummy dielectric 140 between the dummy spacers 130. An interlayer dialectic (ILD) 160 formed on the wafer fills between the dummy spacers 130. Preferably, the ILD 160 is an oxide such as $SiO_2$, or a lower k oxide. The patterned hard mask 128 is removed, e.g., using an oxide CMP, to re-expose the tops of dummy gates 126. In this example, the CMP removes upper portions of the dummy spacers 130 and ILD 160. The exposed dummy gates 126 may be removed, for example, with a suitable etch selective to silicon.

Figure 7:
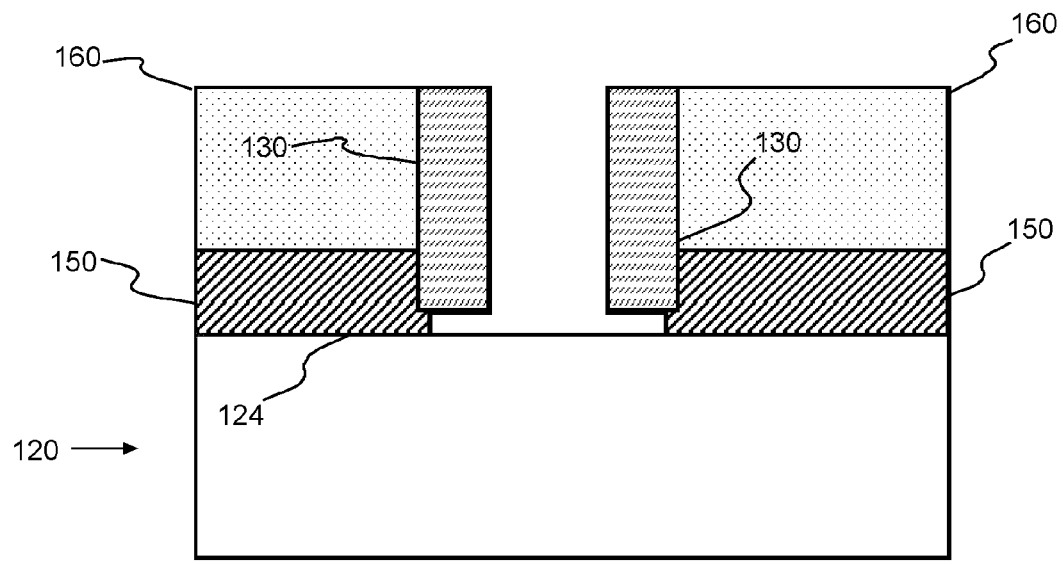
FIG. 7 shows an example of the structure after removing all of the patterned dummy dielectric to re-expose the wafer surface between and beneath the dummy spacers.

FIG. 7 shows an example of the structure after (112 in FIG. 1) removing all of the patterned dummy dielectric to re-expose the wafer surface between and beneath the dummy spacers 130, i.e., at the channel and extensions. The patterned dummy dielectric may be removed using any suitable wet etch, such as a hydrofluoric acid (HF) based solution, or a highly selective dry etch.

Figure 8A:
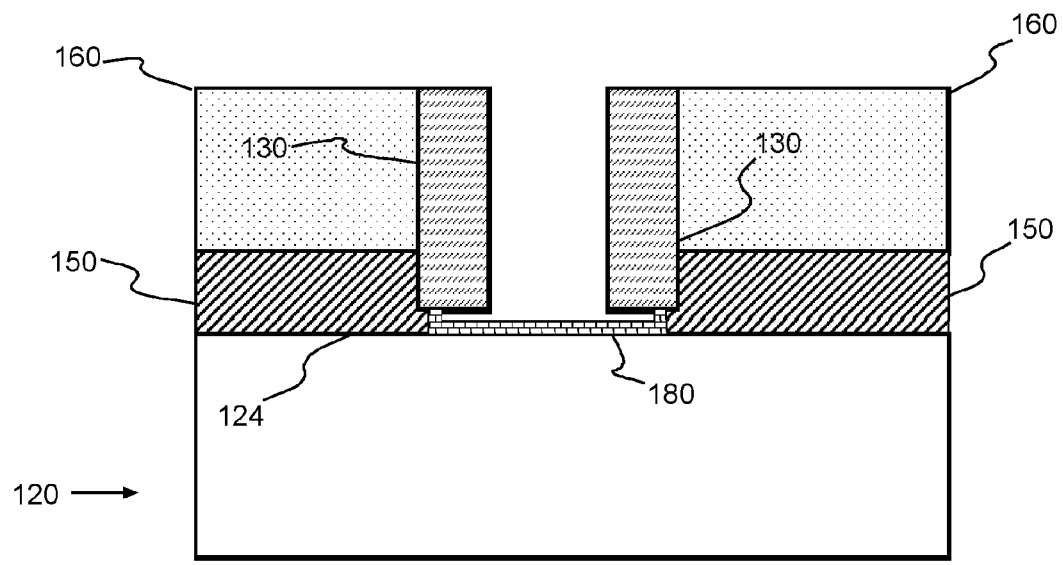
FIGS. 8A-C show an example of forming source/drain extensions under the dummy spacers.
Figure 8B:
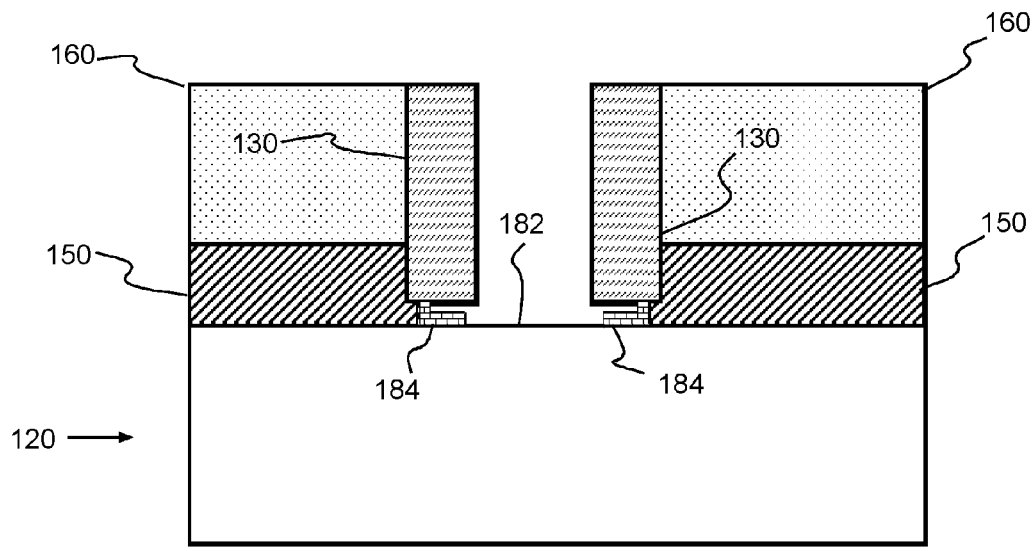
Figure 8C:
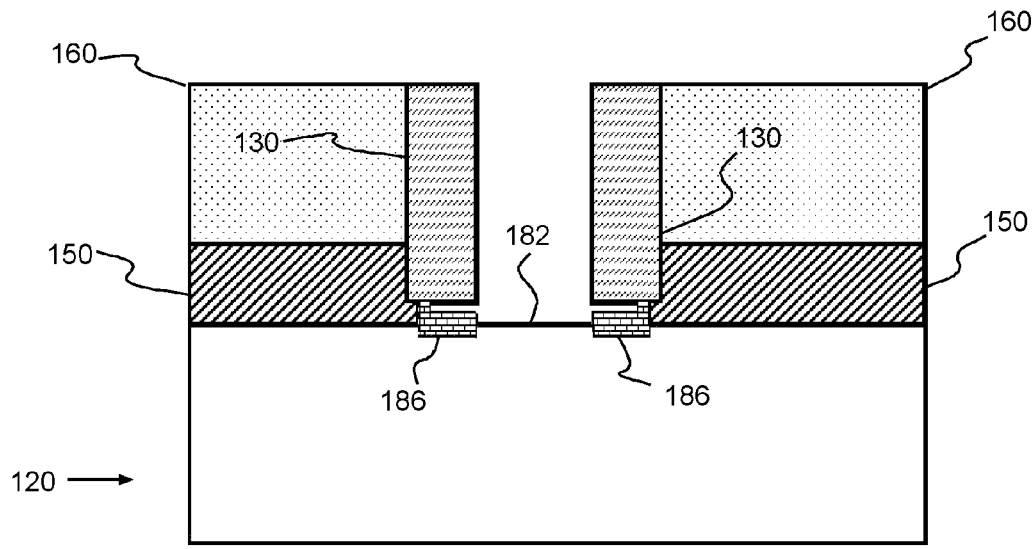
Figure 9A:
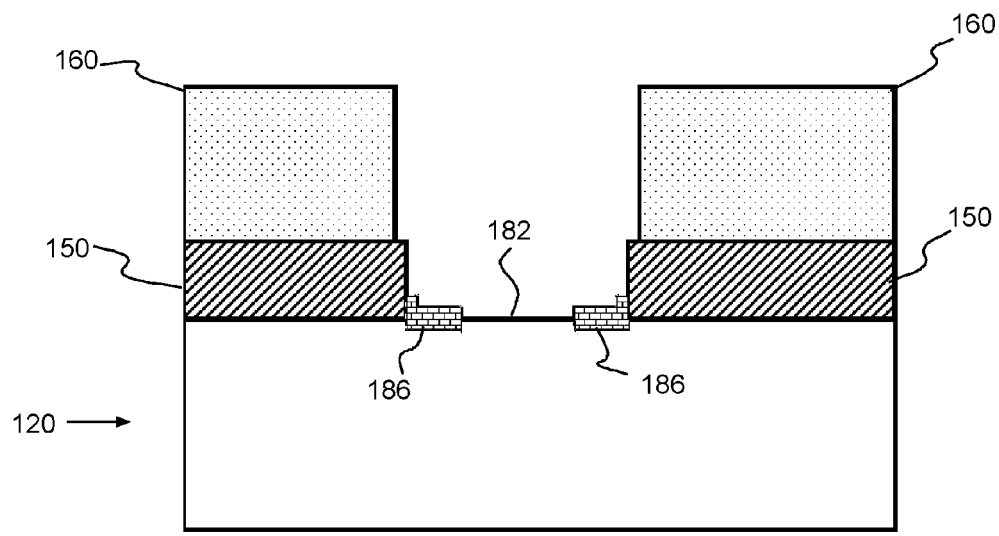
FIGS. 9A-D show an example of forming metal gates above the channel, between the source/drain extensions to complete the RMG FETs.
Figure 9B:
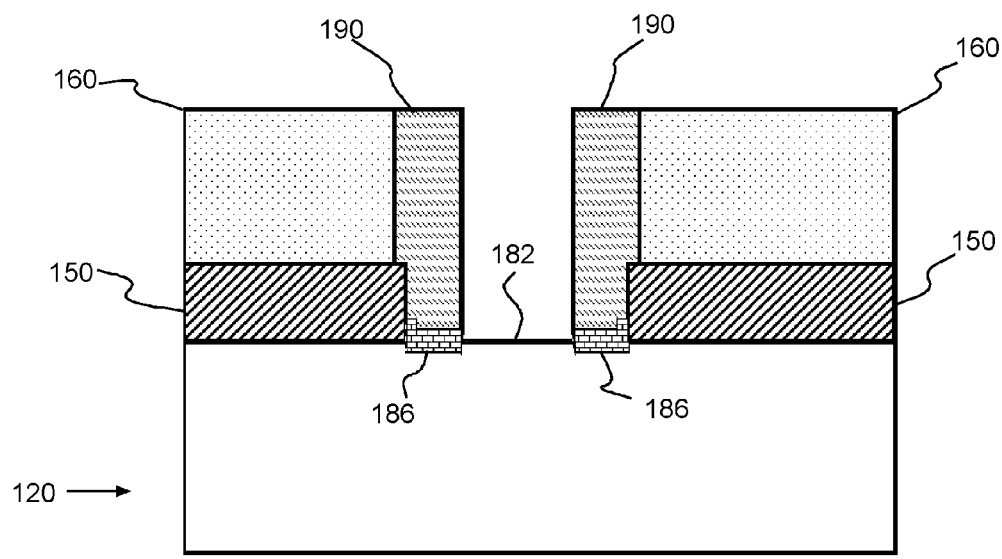
Figure 9C:
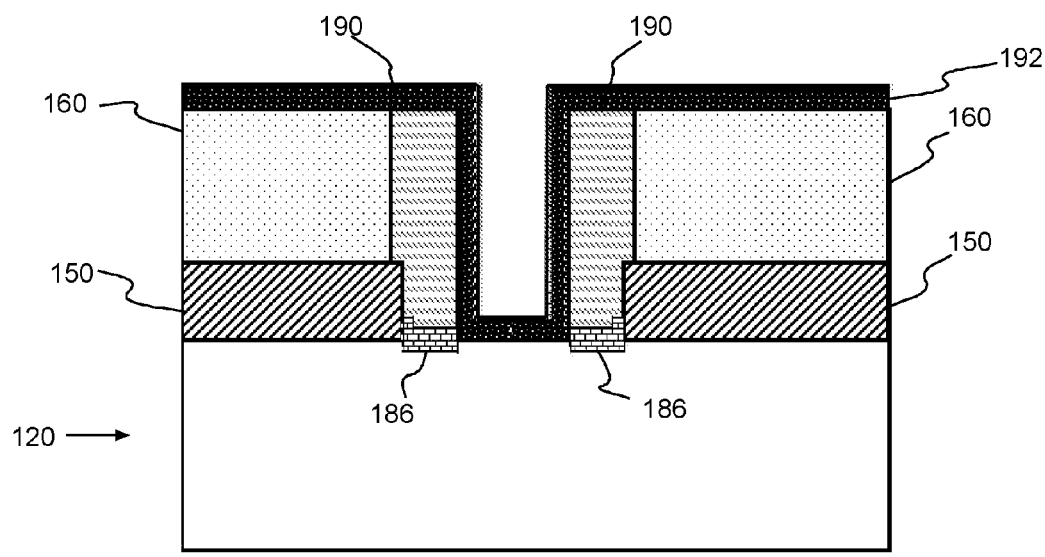
Figure 9D:
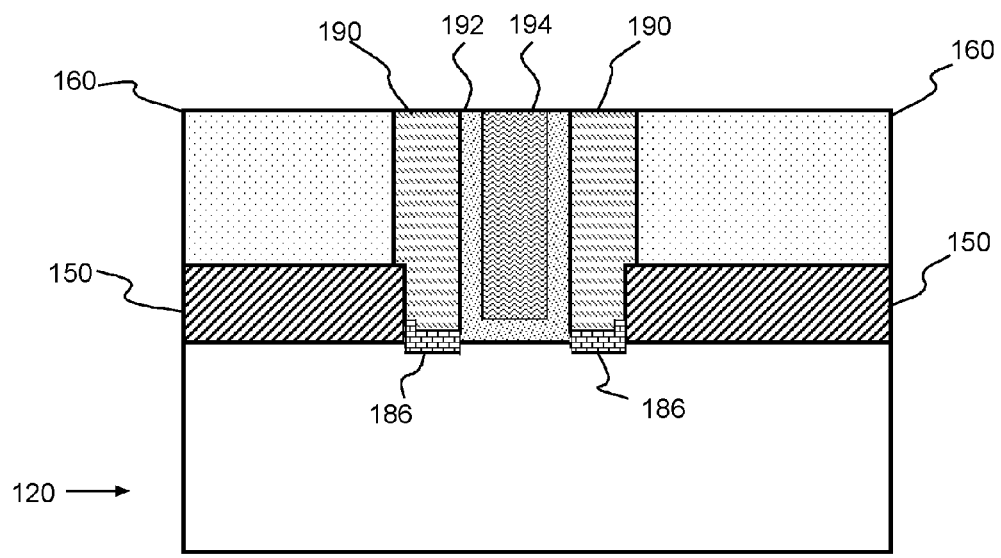

FIGS. 8A-C show an example of forming (114 in FIG. 1) source/drain extensions under the dummy spacers 130. Preferably, source/drain extensions are formed by depositing and selectively patterning an atomic layer dopant through the open space between the dummy spacers. A dopant diffusion step, e.g., an extension anneal, forms well controlled source/drain extensions from the patterned atomic layer dopant.

In one preferred embodiment, a seven angstrom (7 Å) atomic layer dopant (ALDo) is deposited on the wafer selective to the dummy spacers 130, forming ALDo 180 where previously existing patterned dummy dielectric was removed. Suitable atomic layer dopants include atomic boron or germanium-boron for PFETs and atomic phosphorous (P) for NFETs. Selectively etching ALDo 180, e.g., in a timed etch, removes the dopant from the FET channel surface 182, leaving dopant pockets 184 (<3 nm wide) under the dummy spacers 130. A junction rapid anneal drives in the dopant in pockets 184, activating extension 186. Preferably, the junction rapid anneal is at a temperature that does not alter channel material stability. For example, annealing temperature may range from 450-900° C. depending on the channel material with lower temperatures for III-V semiconductor and Ge, and relatively higher temperatures for Si-based channels. Because, there is no need for subsequent high temperature processing steps or anneals, the source/drain extension 186 junctions remain where they form, essentially unaffected by subsequent fabrication steps.

FIGS. 9A-D show an example of forming (116 in FIG. 1) metal gates above the channel, between the source/drain extensions to complete the RMGFETs. First, a suitable selective wet etch strips the dummy spacers 130 away, and exposes the extensions 186. Final low-k spacers 190 are formed above the extensions 186, e.g., by forming a conformal layer of sidewall dielectric and removing horizontal portions with a directional etch, e.g., a reactive ion etch (RIE). Suitable low-k dielectric may include, for example, SiBCN, SiNH or BN. A high-k gate dielectric layer 192 is formed, e.g., deposited, on the wafer. Suitable such high-k dielectric may be, for example, hafnium oxide ($HfO_2$), HfSiO, HfSiON, AlO, $Al_2O_3$, Titanium oxide ($TiO_2$), Lanthanum oxide ($La_2O_3$) or a combination or stack thereof. Metal gates 194 are formed by forming a metal layer on the high-k gate dielectric layer 192 and removing surface portions of the metal layer and high-k dielectric layer 192 to the ILD 160. The surface metal layer and high-k dielectric layer 192 may be removed using a typical CMP that re-planarizes the wafer surface and leaves metal gates 194 in metal gate dielectric 196.

Figure 10:
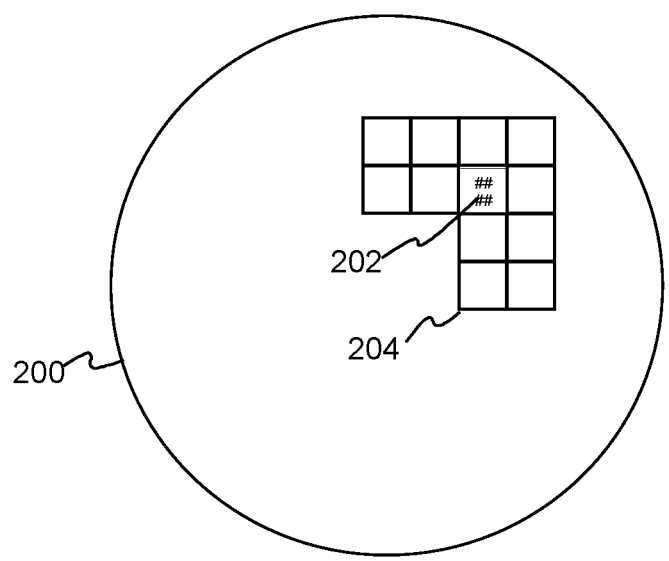
FIG. 10 shows an example of a wafer with multiple IC chips after middle of the line (MOL) dielectric and contact formation and through normal back end of the line (BEOL).

FIG. 10 shows an example of a wafer 200 with multiple IC chips 202 after (118 in FIG. 1) middle of the line (MOL) dielectric and contact formation and through normal back end of the line (BEOL) steps. Circuit definition continues normally as wiring is formed 116 on and above the planarized surface. The wiring connects devices (preferred FETs) together into circuits 202 and circuits 202 together on the chips 204. BEOL fabrication continues complete the chips 204, e.g., connecting the circuits to pads and terminal metallurgy.

Thus advantageously, short channel effects are reduced/minimized in ICs with preferred RMGFETs. Source/drain extensions are formed well controlled, because they are formed after forming interlayer dielectric (ILD) on already completed source/drain regions and just prior to forming metal gates.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming field effect transistors (FETs) on Integrated Circuit (IC) chips, said method comprising:
   forming dummy FETs, each dummy FET including a dummy gate formed on a dummy dielectric layer above an FET channel;
   forming dummy sidewalls on said dummy dielectric layer alongside each dummy gate;
   removing exposed areas of said dummy dielectric layer, dummy dielectric remaining under every said dummy gate and partially under each dummy sidewall;
   forming a source/drain region adjacent to said each dummy sidewall, each said source/drain region extending under an adjacent dummy sidewall to dummy dielectric;
   removing said dummy gates, dummy dielectric being exposed between said dummy sidewalls;
   replacing a portion of said dummy dielectric under said each dummy sidewall with a source/drain extension between the FET channel and a respective source/drain region; and
   forming a metal gate over each said FET channel.

2. A method of forming FETs on IC chips as in claim 1, wherein forming dummy FETs comprises:
   defining said FET channel on the surface of a semiconductor wafer;
   depositing said dummy dielectric layer on said semiconductor wafer;
   depositing a dummy gate material layer on said dummy dielectric layer; and
   patterning said dummy gate material layer.

3. A method of forming FETs on IC chips as in claim 2, wherein forming dummy sidewalls comprises:
   depositing a conformal layer of dummy sidewall material on said semiconductor wafer; and
   removing horizontal portions of said conformal layer, removing said horizontal portions exposing a gate mask on the top of each said dummy gate and exposing the dummy dielectric layer areas.

4. A method of forming FETs on IC chips as in claim 1, wherein removing said dummy gates comprises:
   depositing interlayer dielectric (ILD) on said wafer; and
   planarizing said ILD, planarizing removing each said gate mask and exposing the upper surface of said dummy gates; and
   etching said dummy gates with an etchant selective to the dummy gate material.

5. A method of forming FETs on IC chips as in claim 1, wherein said dummy dielectric layer is on the surface of a semiconductor wafer, and replacing said portion of dummy dielectric comprises:

removing said dummy dielectric layer; and depositing a layer of dopant on the exposed said surface;

removing dopant from said semiconductor surface between said dummy sidewalls, dopant remaining under said dummy sidewalls at said source/drain regions; and diffusing said dopant into said surface, diffused said dopant forming said source/drain extensions.

6. A method of forming FETs on IC chips as in claim 5, wherein said dummy dielectric layer is a 3 to 6 nanometer (3-6 nm) thick oxide layer, depositing said layer of dopant deposits an atomic layer dopant (ALDo) selective to said dummy spacers, and diffusing said dopant comprises annealing said wafer.

7. A method of forming FETs on IC chips as in claim 6, wherein said atomic layer dopant is a seven angstrom (7 Å) layer of boron-nitride (BN) for PFETs and Atomic Phosphorous (P) for NFETs.

8. A method of forming FETs on IC chips as in claim 7, wherein forming a source/drain region epitaxially grows phosphorous or arsenic-doped silicon (Si) for NFET source/drain regions, and boron-doped silicon germanium (SiGe) for PFET source/drain regions.

9. A method of forming FETs on IC chips as in claim 1, wherein forming metal gates comprises:

removing said dummy sidewalls;

forming gate sidewalls over said source/drain extensions;

depositing a conformal layer of high-k dielectric on said semiconductor wafer, said high-k dielectric lining said gate sidewalls and FET channels between said gate sidewalls;

depositing metal on said semiconductor wafer, deposited said metal filling spaces between lined said high-k sidewalls; and removing surface metal and high-k dielectric, lined said metal gates remaining in the filled spaces.

* * * * *